(12) United States Patent
Shintani et al.

(10) Patent No.: US 6,717,059 B2
(45) Date of Patent: Apr. 6, 2004

(54) CIRCUIT BOARD AND CONNECTION STRUCTURE OF TERMINAL PORTION OF THE SAME

(75) Inventors: Toshio Shintani, Osaka (JP); Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/974,048

(22) Filed: Oct. 11, 2001

(65) Prior Publication Data

US 2002/0066594 A1 Jun. 6, 2002

(30) Foreign Application Priority Data

Oct. 18, 2000 (JP) .................................. P. 2000-317416

(51) Int. Cl.[7] .............................................. H05K 1/09
(52) U.S. Cl. .................. 174/251; 174/258; 174/263; 257/766
(58) Field of Search ............................... 174/250–251, 174/255–266, 260–263; 361/767, 776–779, 790–795, 760–762, 803; 257/737–738, 766–768, 779, 781; 438/612–614; 228/180.22; 420/561

(56) References Cited

U.S. PATENT DOCUMENTS

| | | | | | |
|---|---|---|---|---|---|
| 4,778,733 | A | * | 10/1988 | Lubrano et al. | 428/647 |
| 4,929,423 | A | * | 5/1990 | Tucker et al. | 420/561 |
| 5,477,419 | A | * | 12/1995 | Goodman et al. | 361/760 |
| 5,838,069 | A | * | 11/1998 | Itai et al. | 257/703 |
| 5,858,518 | A | * | 1/1999 | Omote et al. | 428/209 |
| 6,198,052 | B1 | * | 3/2001 | Omote et al. | 174/255 |
| 6,225,569 | B1 | * | 5/2001 | Hashimoto et al. | 174/255 |

* cited by examiner

*Primary Examiner*—David A. Zarneke
*Assistant Examiner*—Tuan Dinh
(74) *Attorney, Agent, or Firm*—Sughrue Mion, PLLC

(57) ABSTRACT

A nickel plating layer having a thickness within a range of 1.0 to 4.0 μm is formed in a terminal portion of a circuit board as an underlying plating layer. After a soldering bump is formed on the underlying plating layer, the soldering bump is connected to an external terminal formed in an external circuit.

10 Claims, 10 Drawing Sheets

CIRCUIT BOARD AND CONNECTION STRUCTURE OF TERMINAL PORTION OF THE SAME

CROSS-REFERENCE TO RELATED APPLICATION

The present application is based on Japanese patent application No. 2000-317416, which is incorporated herein by reference.

BACKGROUND OF THE INVENTION

1. Field of the Invention

The present invention relates to a circuit board and a connection structure of a terminal portion of the circuit board; and particularly relates to a circuit board that is suitably used as a circuit-provided suspension substrate for a hard disk drive, and a connection structure of a terminal portion of the circuit board.

2. Description of Related Art

Generally, a terminal portion for connection with an external terminal formed in an external circuit is formed in a circuit board for use in electronic parts or electronic equipment.

For example, in the circuit-provided suspension substrate, generally, the terminal portion is formed through the steps of: forming a nickel plating layer and a gold plating layer successively, as an underlying plating layer, on a conductor pattern in a specific portion where the terminal portion is to be formed, and forming a soldering bump containing lead and tin on the underlying plating layer.

On the other hand, another gold plating layer is formed as an external terminal in an external circuit such as a read/write substrate to be connected to the circuit-provided suspension substrate.

The above-mentioned circuit-provided suspension substrate and the read/write substrate is designed to be electrically connected with each other if the soldering bump which has been formed in the terminal portion of the circuit-provided suspension substrate is joined by thermocompression bonding to the gold plating layer which has been formed in the external terminal of the read/write substrate.

To improve the connection reliability of the circuit board, it is required to improve the connection strength between the terminal portion of the circuit board and the external terminal of the external circuit from the initial stage of connection. Particularly, because the above-described circuit-provided suspension substrate is used for a hard disk drive, high connection strength from the initial stage of connection is required of the circuit-provided suspension substrate.

SUMMARY OF THE INVENTION

Taking the above circumstance into consideration, an object of the present invention is to provide a circuit board which is capable of obtaining high connection strength between a terminal portion of the circuit board and an external terminal of an external circuit from the initial stage of connection so as to improve the connection reliability, and to provide a connection structure of the terminal portion of the circuit board.

In order to achieve the above object, according to the present invention, there is provided a circuit board having a terminal portion for connection with an external terminal formed in an external circuit, the terminal portion including a nickel plating layer and a soldering bump, the nickel plating layer having a thickness within a range of 1.0 to 4.0 $\mu$m.

According to the present invention, preferably, the soldering bump contains tin and at least one of silver and copper. More preferably, the soldering bump contains tin, silver and copper.

According to the present invention, the circuit board may be suitably applied to a circuit-provided suspension substrate.

Further, according to the present invention, there is provided a connection structure for connecting a terminal portion of a circuit board with an external terminal formed in an external circuit, the terminal portion including a nickel plating layer and a soldering bump, the nickel plating layer having a thickness within a range of 1.0 to 4.0 $\mu$m.

BRIEF DESCRIPTION OF THE DRAWINGS

FIGS. 1A and 1B are main-part sectional views showing an embodiment of a circuit board according to the present invention, in which FIG. 1A shows a terminal portion and FIG. 1B shows a terminal portion connected to an external terminal of an external circuit;

FIGS. 5A through 5D are sectional views showing the steps of preparing a supporting substrate and forming a base layer in a predetermined pattern on the supporting substrate, in which FIG. 5A is the step of preparing the supporting substrate, FIG. 5B is the step of forming a film of a photosensitive polyimide resin precursor on the supporting substrate, FIG. 5C is the step of exposing and developing the film through a photo mask into the predetermined pattern, and FIG. 5D is the step of curing the patterned film so as to form a base layer;

FIGS. 6A through 6E are sectional views showing the steps of forming a conductive layer in a predetermined pattern on the base layer, in which FIG. 6A is the step of forming an underlying layer on the supporting substrate and the base layer, FIG. 6B is the step of forming a plating resist in an inverse pattern to the predetermined circuit pattern on the underlying layer, FIG. 6C is the step of forming a conductive layer in the predetermined pattern by electrolytic plating on a portion of the base layer where the plating resist is not formed, FIG. 6D is the step of removing the plating resist, and FIG. 6E is the step of removing the underlying layer;

FIGS. 7A through 7D are sectional views showing the steps of protecting a surface of the conductive layer in the circuit pattern with a metal film, and then covering the protected conductive layer with a cover layer, in which FIG. 7A is the step of forming the metal film on the surface of the conductive layer, FIG. 7B is the step of forming a film of a photosensitive polyimide resin precursor on the base layer and the metal film, FIG. 7C is the step of exposing and developing the film through a photo mask so as to perform patterning on the film, and FIG. 7D is the step of curing the patterned film so as to form the cover layer;

FIGS. 8A, 8B and 8C are sectional views showing the steps of forming external side connection terminals, in which FIG. 8A is the step of peeling off the metal film formed on the conductive layer and the supporting substrate which are exposed partially, FIG. 8B is the step of forming an underlying plating layer on the exposed conductive layer, FIG. 8C is the step of forming soldering bumps on the underlying plating layer;

DETAILED DESCRIPTION OF THE PREFERRED EMBODIMENTS

Figure 1A:
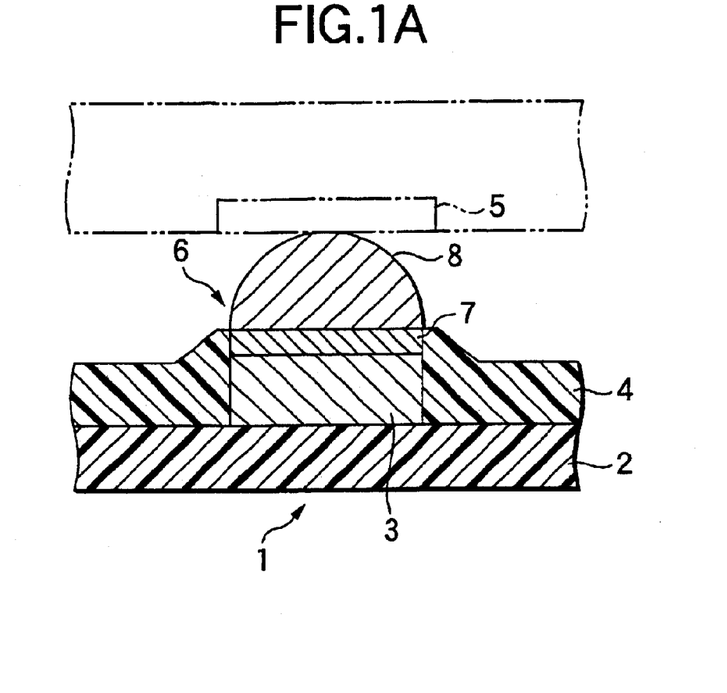
Figure 1B:
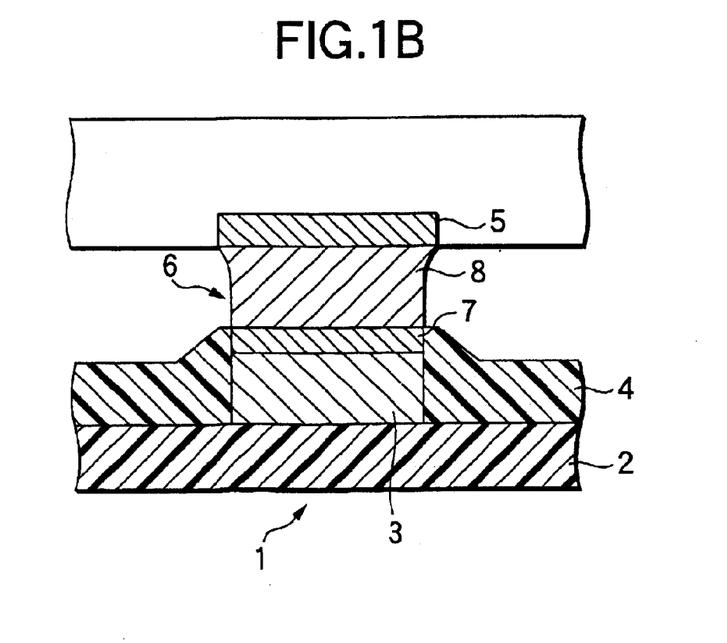

FIGS. 1A and 1B are main-part sections showing an embodiment of a circuit board according to the present invention. In FIG. 1A, the circuit board 1 is formed by sequentially laminated, for example, a base layer 2 made of an insulator, a conductive layer 3 formed as a predetermined circuit pattern, and a cover layer 4 made of an insulator for covering the conductive layer 3.

As each of the insulators of the base layer 2 and the cover layer 4, synthetic resin such as polyimide resin, acrylic resin, polyether nitrile resin, polyether sulfonic resin, polyethylene terephthalate resin, polyethylene naphthalate resin, polyvinyl chloride resin, or the like may be used, and, preferably, polyimide resin is used. Further, examples of the conductor for forming the conductive layer 3 may include copper, nickel, gold, solder, or alloys of these metals, and copper is preferably used.

Further, the thickness of the base layer 2 is generally set to 5–30 μm, preferably 8–18 μm; the thickness of the cover layer 4 is generally set to 0.5–8 μm, preferably 3–5 μm; and the thickness of the conductive layer 3 is generally set to 3–25 μm, preferably 7–18 μm.

To form the conductive layer 3 in the predetermined circuit pattern on the base layer 2, a known patterning method such as a subtractive method, an additive method, a semi-additive method, or the like may be used. To form the cover layer 4 on the conductive layer 3, a known method such as adhesion of film-like resin, application and curing of photosensitive resin, or the like, may be used.

On the circuit board 1, a terminal portion 6 is formed for connection with an external terminal 5 formed in an external circuit. The terminal portion 6 is formed on a surface of the conductive layer 3 which is exposed by opening the cover layer 4. The terminal portion 6 is constituted by an underlying plating layer 7 and a soldering bump 8. The opening of the cover layer 4 may be formed by a known method such as drilling, laser machining, patterning with photosensitive resin, or the like.

The underlying plating layer 7 includes a nickel plating layer formed by nickel plating. The nickel plating layer may be formed by either electrolytic plating or electroless plating. The thickness of the nickel plating layer is set to 1.0–0.4 μm, preferably 1.0–2.5 μm. If this thickness is smaller than 1.0 μm, the connection strength of the nickel plating layer is reduced. On the other hand, if this thickness is larger than 4.0 μm, intrinsic stress may be accumulated in the nickel plating layer and this intrinsic stress may spoil the flatness of the underlying plating layer 7 or may cause cracks in the under plating layer 7. If the thickness is larger than 2.5 μm, the above-mentioned tendency may more or less occur. Accordingly, it is preferable to form the nickel plating layer with a thickness of 1.0–2.5 μm.

Figure 2:
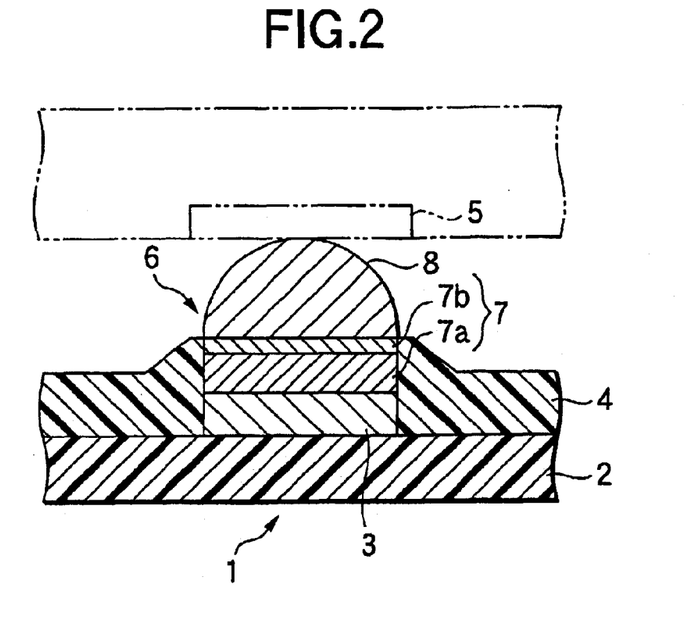
FIG. 2 is a main-part sectional view showing a mode in which a gold plating layer is formed on a nickel plating layer in the terminal portion shown in FIGS. 1A and 1B.

In the underlying plating layer 7, a gold plating layer formed by gold plating may be provided on the nickel plating layer if necessary. The gold plating layer may be formed by either electrolytic plating or electroless plating. The thickness of the gold plating layer is preferably set to be not greater than 5 μm, more preferably not greater than 0.5 μm. FIG. 2, for example, shows a mode in which such a gold plating layer is formed. In FIG. 2, a gold plating layer 7b is formed on a nickel plating layer 7a, and a soldering bump 8 which will be described later is formed on the gold plating layer 7b.

The shape of the underlying plating layer 7 is not limited but may be a rectangle or a circle.

The soldering bump 8 is formed on the underlying plating layer 7. The composition of the solder for use in the soldering bump 8 is not specifically limited. For example, lead, tin, silver, copper, alloys of these metals, or the like may be used. Of these metals or alloys, solder of a generally-used composition of lead and tin may be used.

Further, as for the composition of the solder, it is preferable that tin as an essential component and at least one of silver and copper are contained. More specifically, it is preferable to use a solder which contains any of a two-component composition of tin and silver, a two-component composition of tin and copper, and a three-component composition of tin, silver and copper. If a solder having such a composition is used, the connection strength is maintained surely without occurring any interfacial fracture even through, for example, the solder bump 8 connected with the external terminal 5 are put to a heat cycle test repeating high and low temperatures. High connection reliability can be therefore ensured for a long term even under a severe atmosphere condition with high and low temperatures repeated. Particularly, if the solder of the three-component composition of tin, silver and copper is used, the connection strength after the heat cycle test can be more improved.

Further, the composition ratio among these tin, silver and copper is appropriately selected in such a range that tin accounts for 95–97% by weight; silver accounts for 0–4% by weight (4% or less by weight when mixed), preferably 0.3–3.5% by weight; and copper accounts for 0–4% by weight (4% or less by weight when mixed), preferably 0.2–1.2% by weight with respect to 100% by weight of the sum of these tin, silver and copper. These tin, silver and copper are mixed so that the total amount thereof is preferably 95% by weight or more, more preferably 98% by weight or more, further preferably 100% by weight in metal components of the solder composition for use in the soldering bump 8. The metal components of the solder may include zinc, indium, bismuth or the like as a trace component.

The height of the soldering bump 8 (distance from its lower surface to its top) is usually 20–250 μm, preferably 50–170 μm. Similarly to the underlying plating layer 7, the shape of the soldering bump 8 is not at all limited.

Further, such a soldering bump 8 may be formed, for example, by mixing powder of solder having the aforementioned composition with organic binder to prepare soldering paste, by screen-printing the soldering paste on a specific portion where a terminal portion 6 is to be formed, and then by heating the screen-printed soldering paste in a reflow furnace or the like so as to bake and remove the organic binder from the soldering paste. Thereafter, the soldering bump 8 may be washed with water or cleaned with an organic solvent, if necessary.

The terminal portion 6 formed in this manner is connected to the external terminal 5 of the external circuit to thereby form a connection structure as shown in FIG. 1B. That is, in this connection structure, the soldering bump 8 of the terminal portion 6 is, for example, joined to the external terminal 5 of the external circuit by thermocompression bonding according to a conventional method, so that the external terminal 5 is electrically connected with the conductive layer 3 through the terminal portion 6.

In such a connection structure, the underlying plating layer 7 of the terminal portion 6 is formed by the nickel plating layer having a thickness of 1.0–4.0 $\mu$m, and the soldering bump 8 is formed on the underlying plating layer 7 (or on a gold plating layer when the gold plating layer is necessarily provided). This connection structure can therefore surely improve the connection strength from the initial stage of connection.

In the circuit board shown in FIGS. 1A and 1B, only the surface of conductive layer 3 is exposed at the opening of the cover layer 4. However, as shown in FIG. 3, for example, the cover layer 4 may be opened more widely in such a manner that not only the surface of the conductive layer 3 but also side faces thereof are exposed to thereby form the terminal portion 6 on the surface and the side faces of the conductive layer 3.

Figure 3:
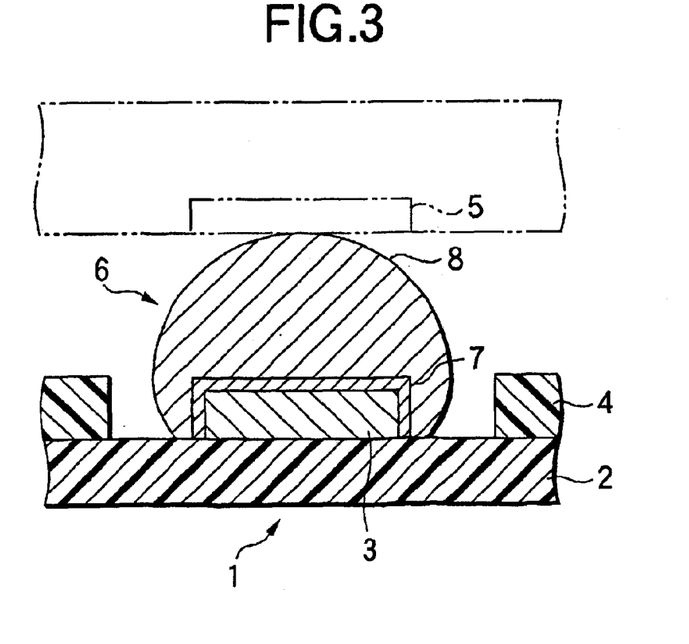
FIG. 3 is a main-part sectional view showing a mode in which a terminal portion is formed on a surface and side faces of a conductive layer in the circuit board shown in FIGS. 1A and 1B.

In other words, as shown in FIG. 3, the cover layer 4 is opened more widely to expose the surface and the side faces of the conductive layer 3 to thereby form the underlying plating layer 7 on the surface and the side faces of the conductive layer 3, and to thereby form the soldering bump 8 on the surface and the side faces of the conductive layer 3.

Such a circuit board is suitably applicable to a circuit-provided suspension substrate that requires high connection strength from the initial stage of connection. Next, explanation will be given to such a circuit-provided suspension substrate.

Figure 4:
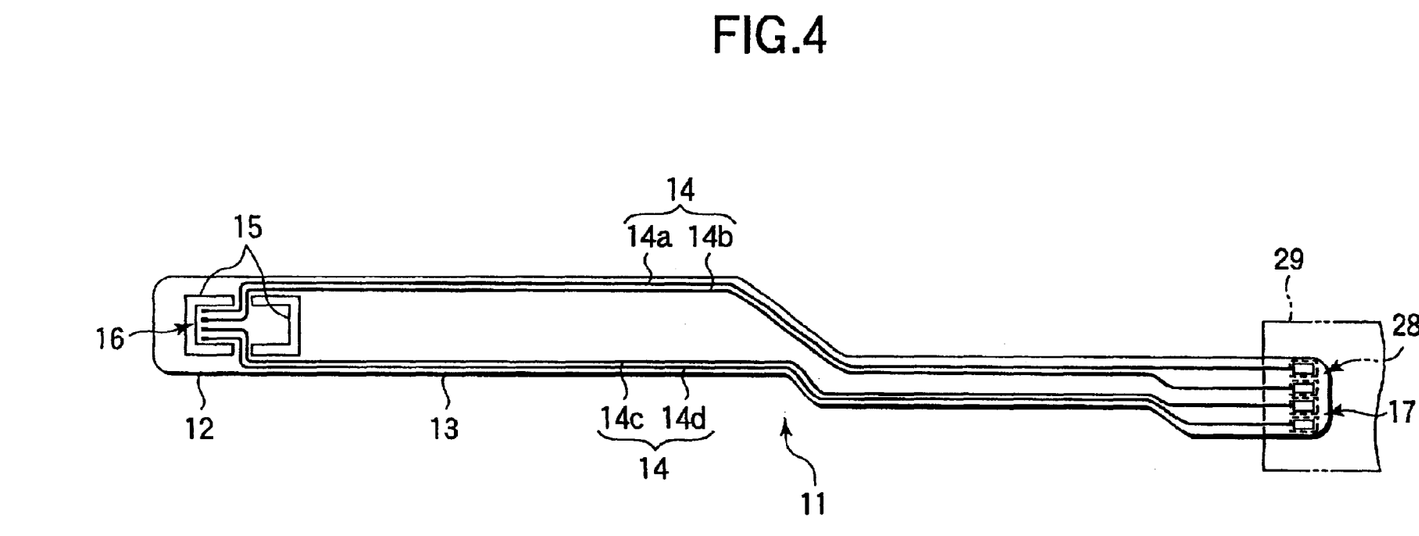
FIG. 4 is a plan view showing an embodiment of a circuit-provided suspension substrate.

FIG. 4 is a plan view showing an embodiment of the circuit-provided suspension substrate. In FIG. 4, the circuit-provided suspension substrate 11 is provided for mounting a magnetic head (not shown) for a hard disc drive and for supporting the magnetic head against air flow when the magnetic head and a magnetic disc relatively travel while a minor space is kept between the suspension substrate 11 and the magnetic disk. In the circuit-provided suspension substrate 11, wirings for connecting the magnetic head and a read/write substrate 29 serving as the external circuit are integrally formed as a predetermined circuit pattern.

In the circuit-provided suspension substrate 11, a base layer 13 which is made of an insulator is formed on a supporting substrate 12 extending in the longitudinal direction, and a conductive layer 14 is formed as a predetermined circuit pattern on the base layer 13. This circuit pattern is formed as a plurality of wirings 14a, 14b, 14c, and 14d disposed in parallel with one another at a predetermined interval. Gimbals 15 for mounting the magnetic head are formed by cutting partially the supporting substrate 12 at a front end portion of the supporting substrate 12. Further, magnetic head side connection terminals 16 for connecting the magnetic head and the wirings 14a, 14b, 14c, and 14d respectively are also formed at the front end portion of the supporting substrate 12, while external side connection terminals 17 serving as terminal portions for connecting the external terminals 28 of the read/write substrate 29 with the wirings 14a, 14b, 14c, and 14d respectively are formed at a read end portion of the supporting substrate 12.

Although not shown in FIG. 4, a cover layer 18 made of an insulator is actually formed on the conductive layer 14.

Next, description will be given to a method for manufacturing such a circuit-provided suspension substrate 11 with reference to FIGS. 5A to 5D, FIGS. 6A to 6E, FIGS. 7A to 7D, and FIGS. 8A to 8C. Incidentally, FIGS. 5A to 5D, FIGS. 6A to 6E, FIGS. 7A to 7D, and FIGS. 8A to 8C, the right sides show sections of a portion where the external side connection terminals 17 of the circuit-provided suspension substrate 11 are formed along the longitudinal direction of the wirings 14a, 14b, 14c and 14d, while the left sides show partial sections of the longitudinal middle of the circuit-provided suspension substrate 11 along a direction perpendicular to the longitudinal direction of the wirings 14a, 14b, 14c, and 14d.

First, as shown in FIGS. 5A to 5D, the supporting substrate 12 is prepared so that the base layer 13 is formed in a predetermined pattern thereon. For the supporting substrate 12, it is preferable to use a sheet of metal foil or a metal thin plate. For instance, stainless steel 42 alloy or the like may be preferably used. Further, the thickness of the supporting substrate 12 is preferably set to 10–60 $\mu$m, more preferably 15–30 $\mu$m, and the width thereof is preferably 50–500 mm, more preferably 125–300 mm.

Figure 5A:
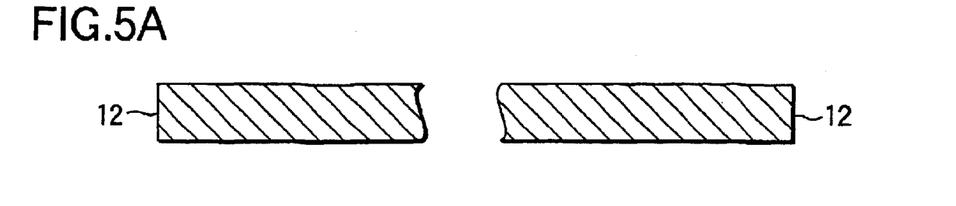

Further, as the insulator to form the base layer 13, an insulator similar to the above-described one may be used, and photosensitive synthetic resin, particularly photosensitive polyimide resin may be preferably used.

Figure 5B:
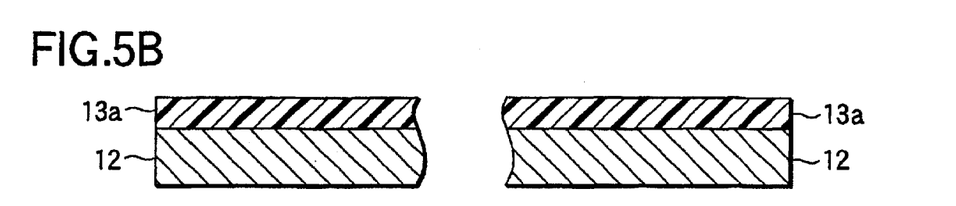

For example, in the case where photosensitive polyimide resin is used to form the base layer 13 in the predetermined pattern on the supporting substrate 12, first, as shown in FIG. 5B, a solution of a photosensitive polyimide resin precursor (e.g., polyamic acid resin or the like) is applied onto an entire surface of the supporting substrate 12 previously prepared as shown in FIG. 5A. Thereafter, by heating the applied solution of the photosensitive polyimide resin precursor, for example, at 60–150° C., preferably at 80–120° C., a film 13a of the photosensitive polyimide resin precursor is formed.

Figure 5C:
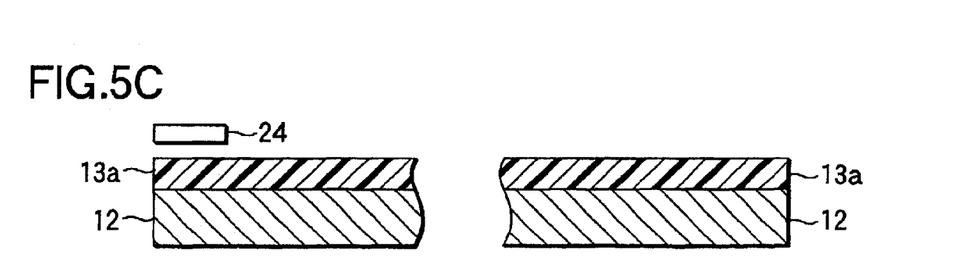

Next, as shown in FIG. 5C, the film 13a is exposed through a photo mask 24 and the exposed portion of the film 13a may be heated to a predetermined temperature according to necessity. Then, the film 13a is developed to thereby form a predetermined pattern. Irradiation rays which irradiate the film 13a through the photo mask 24 have preferably an exposure wavelength of 300–450 nm, more preferably an exposure wavelength of 350–420 nm, and the integrated value of the exposure energy is preferably 100–1,000 mJ/cm$^2$, more preferably 200–700 mJ/cm$^2$. Further, the exposed portion of the film 13a irradiated with the irradiation rays is made soluble (positive) in the next development by heating the exposed portion, for example, in a temperature range which is not lower than 130° C. and lower than 150° C. Alternatively, the exposed portion of the film 13a irradiated with the irradiation rays is made insoluble (negative) in the next development by heating the film 13a, for example, in a temperature range which is not lower than 150° C. and not higher than 180° C. Further, development may be performed by using a known developer such as an alkali developer or the like and by a known method such as a dip development method, a spray development method, or the like. In this method, it is preferable to obtain a negative pattern, and FIGS. 5A to 5D show a mode for forming a negative pattern.

Figure 5D:
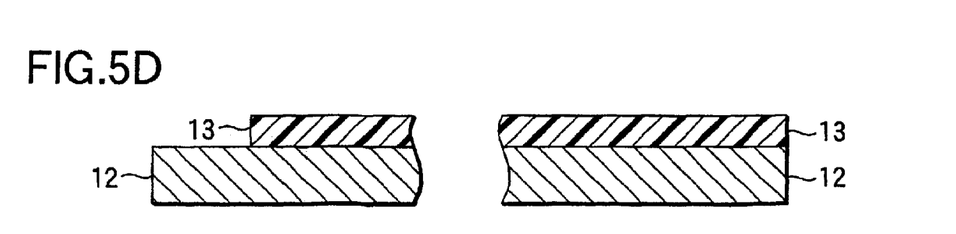

Then, as shown in FIG. 5D, the film 13a of the polyimide resin precursor patterned as described above is cured (imidized), for example, by heating to 250° C. or higher finally. In such a manner, the base layer 13 composed of polyimide resin is formed into a predetermined pattern.

In the case where photosensitive resin is not used, for example, the supporting substrate 12 may be coated with resin or the resin may be laminated as a dry film on the supporting substrate 12 to form the predetermined pattern.

Further, the base layer 13 formed thus has, for example, a thickness of 2–30 μm, preferably 5–20 μm.

Subsequently, the conductive layer 14 is formed on the base layer 13 in a predetermined circuit pattern. The conductive layer 14 formed as the predetermined circuit pattern may be made of a conductor similar to the aforementioned one, and copper is preferably used. In addition, when the conductive layer 14 is to be formed into the predetermined circuit pattern, the conductive layer 14 may be formed on the surface of the base layer 13 as the predetermined circuit pattern by a known patterning method such as a subtractive method, an additive method, a semi-additive method or the like.

In the subtractive method, the conductive layer 14 is first laminated on the entire surface of the base layer 13 through an adhesive layer if necessary, and an etching resist is next formed on the conductive layer 14 in correspondence to the predetermined circuit pattern. Under this condition, the conductive layer 14 is etched by using the etching resist as a resist, and thereafter the etching resist is removed.

Further, in the additive method, a plating resist is first formed on the base layer 13 as an inverse pattern to the predetermined circuit pattern, the conductive layer 14 is next formed as the predetermined circuit pattern by plating on the surface of the base layer 13 where the plating resist is not formed, and thereafter, the plated resist is removed.

In addition, in the semi-additive method, a conductive thin film is first formed, as an underlying layer, on the base layer 13 a plating resist is next formed on the underlying layer in an inverse pattern to the predetermined circuit pattern; then, the conductive layer 14 is formed, as the predetermined circuit pattern by plating on the surface of the underlying layer where the plated resist is not formed; and thereafter, the plating resist and the underlying layer on which the plating resist is laminated are removed.

Figure 6A:
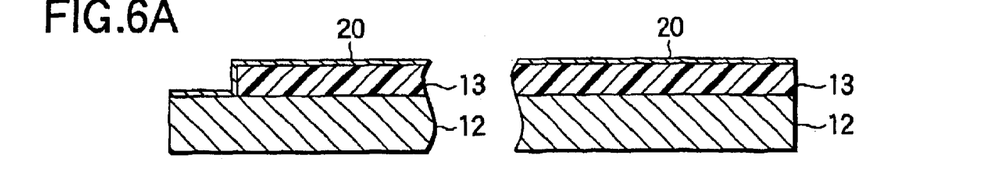

Among these patterning methods, it is preferable to employ the semi-additive method as shown in FIGS. 6A to 6D. That is, as shown in FIG. 6A, a conductive thin film to be an underlying layer 20 is first formed on the entire surfaces of the supporting substrate 12 and the base layer 13. To form the underlying layer 20 vacuum deposition, particularly sputtering deposition is preferably used. Further, chrome, copper, or the like is preferably used as the conductor which is the underlying layer 20. More specifically, for example, it is preferable to form a chrome thin film and a copper thin film successively on the entire surfaces of the supporting substrate 12 and the base layer 13 by sputtering deposition. Preferably, the thickness of the chrome thin film is set to 100–600 Å and the thickness of the copper thin film is set to 500–2,000 Å.

Figure 6B:
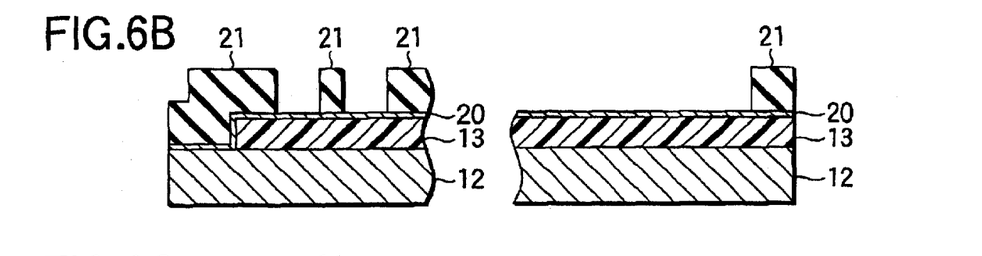
Figure 6C:
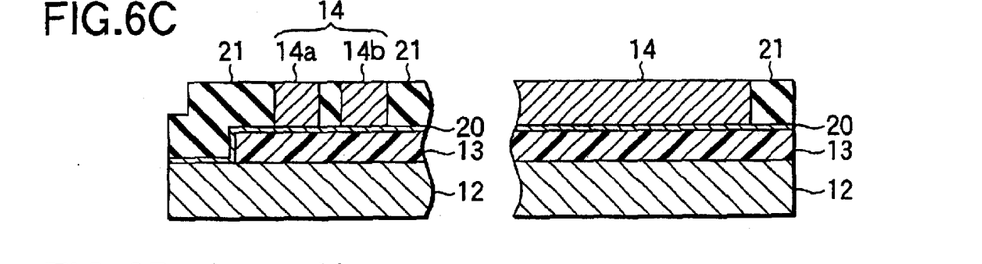

Next, as shown in FIG. 6B, a plating resist 21 is formed on the underlying layer 20 into an inverse pattern to a predetermined circuit pattern. The plating resist 21 may be formed as the predetermined resist pattern, for example, by a known method using a dry film resist, or the like. Next, as shown in FIG. 6C, the conductive layer 14 is formed by plating into the predetermined circuit pattern on a portion of the underlying layer 20 where the plating resist 21 is not formed. Either electrolytic plating or electroless plating may be performed. However, electrolytic plating is preferably used, and electrolytic copper plating is more preferably used. This circuit pattern is formed as a pattern for the plurality of wirings 14a, 14b, 14c and 14d which are disposed in parallel one another at a predetermined interval, for example, as shown in FIG. 4. The thickness of the conductive layer 14 is set, for example, to 2–15 μm, preferably 5–10 μm. The width of each of the wirings 14a, 14b, 14c and 14d is set, for example, to 10–500, μm, preferably 30–200 μm. The interval between the wirings 14a, 14b, 14c and 14d is set, for example, to 10–200 μm, preferably 30–100 μm.

Figure 6D:
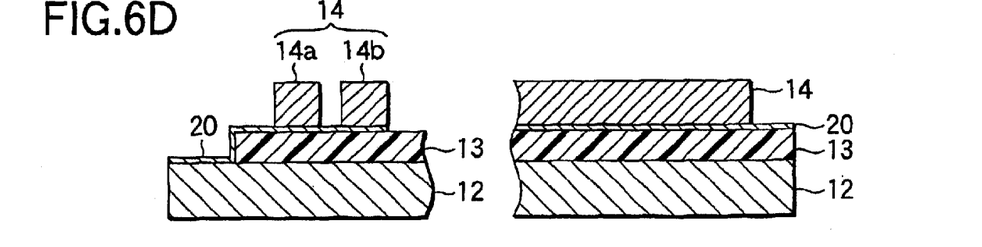
Figure 6E:
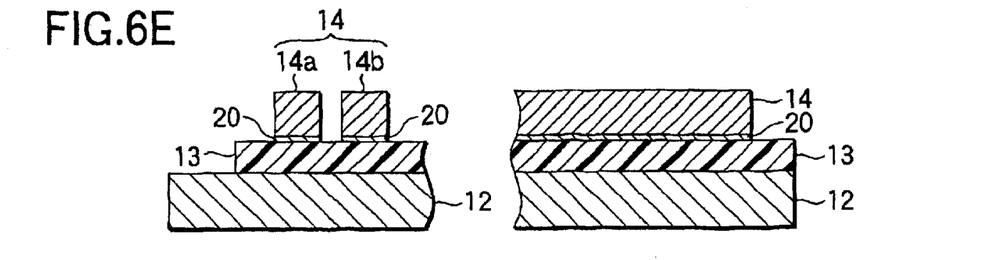

As shown in FIG. 6D, the plating resist 21 is removed, for example, by a known etching method such as chemical etching (wet etching) or by peeling. Thereafter, as shown in FIG. 6E, the portion of the underlying layer 20 where the plated resist had been formed is removed similarly by a known etching method such as chemical etching (wet etching), or the like. In such a manner, the conductive layer 14 is formed as the predetermined circuit pattern on the base layer 13.

Figure 7A:
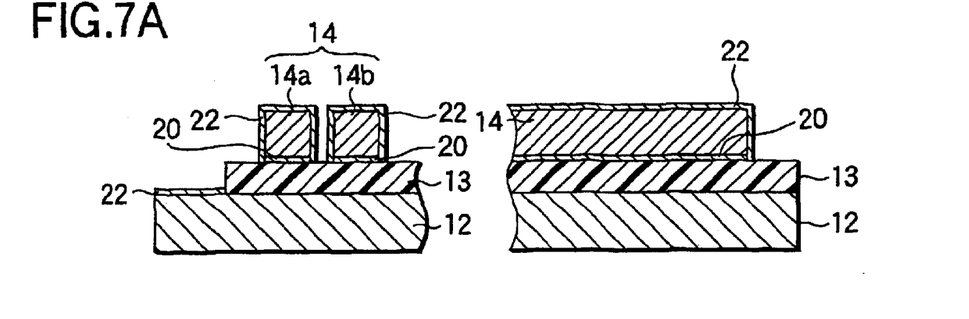

Next, as shown in FIGS. 7A to 7D, after the surface of the conductive layer 14 is protected by a metal film 22, the conductive layer 14 is covered with a cover layer 18 made of an insulator. That is, as shown in FIG. 7A, the metal film 22 is formed on the surface of the conductive layer 14 and the surface of the supporting substrate 12. The metal film 22 is preferably formed as a hard nickel thin film by electroless nickel plating, and the thickness of the metal film 22 may be set to such an extent that the surface of the conductive layer 14 is not exposed. For example, the thickness may be set to about 0.05–0.1 μm.

Figure 7B:
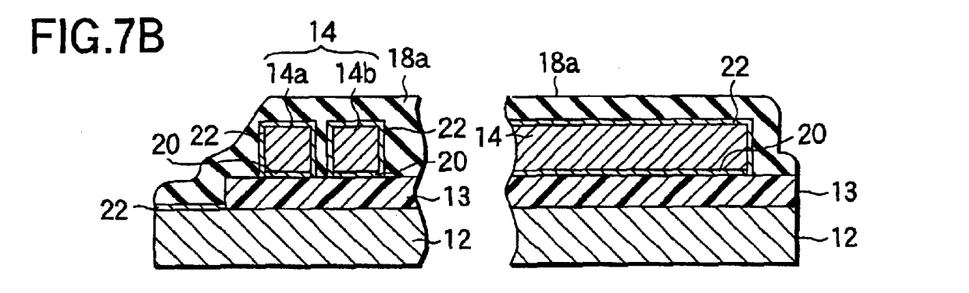

Next, the cover layer 18 for covering the conductive layer 14 is formed as a predetermined pattern. As the insulator for forming the covering layer 18, an insulator similar to that of the base layer 13 may be used, and photosensitive polyimide resin is preferably used.

Figure 7C:
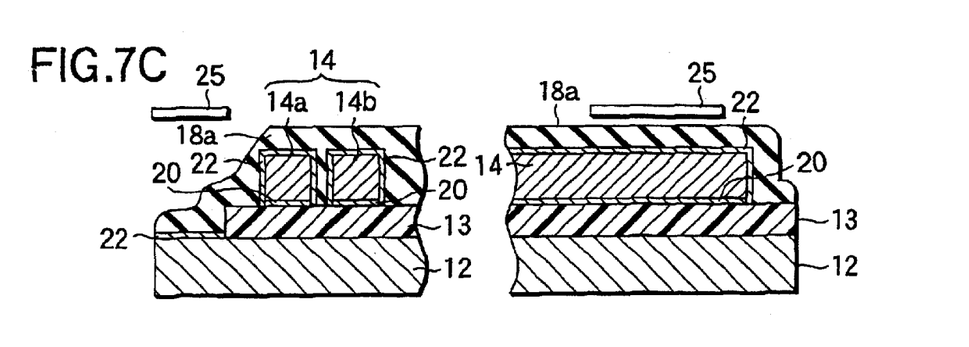

For example, in the case where the cover layer 18 is to be formed by using photosensitive polyimide resin, a solution of a photosensitive polyimide precursor is applied entirely onto the base layer 13 and the metal film 22 as shown in FIG. 7B, and thereafter, a film 18a of the photosensitive polyimide precursor is formed by heating the applied solution of the photosensitive polyimide precursor, for example, at 60–150° C., preferably at 80–120° C. Next, as shown in FIG. 7C, the film 18a is exposed through a photo mask 25, and developed after the exposed portion is heated to a predetermined temperature if necessary, so that patterning is performed in such a manner that the conductive layer 14 is covered with the film 18a. Further, as shown in FIG. 7C, in this patterning, a specific portion of the conductive layer 14 where the external side connection terminals 17 are to be formed is exposed. Conditions for the exposure and development of the conductive layer 14 may be set to be the same as those for the base layer 13. Furthermore, it is preferable to obtain a negative pattern. FIGS. 7A to 7D show a mode for carrying out negative patterning.

Figure 7D:
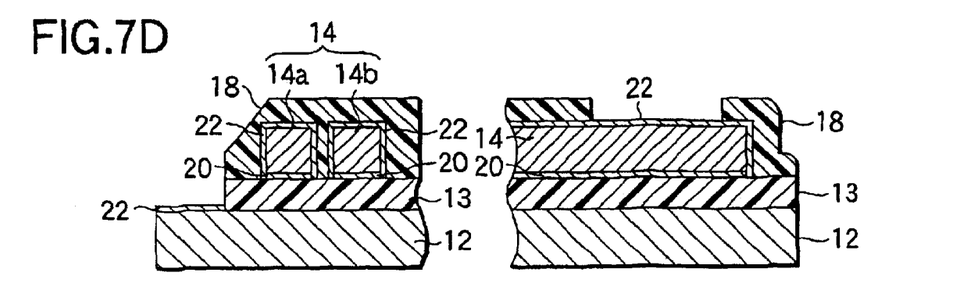

As shown in FIG. 7D, the film 18a of the polyimide resin precursor patterned thus is cured (imidized), for example, by heating to 250° C. or higher finally. In such a manner, the cover layer 18 composed of polyimide resin is formed on the conductive layer 14. The thickness of the cover layer 18 is set, for example, to 1–30 μm, preferably 2–5 μm.

Figure 8A:
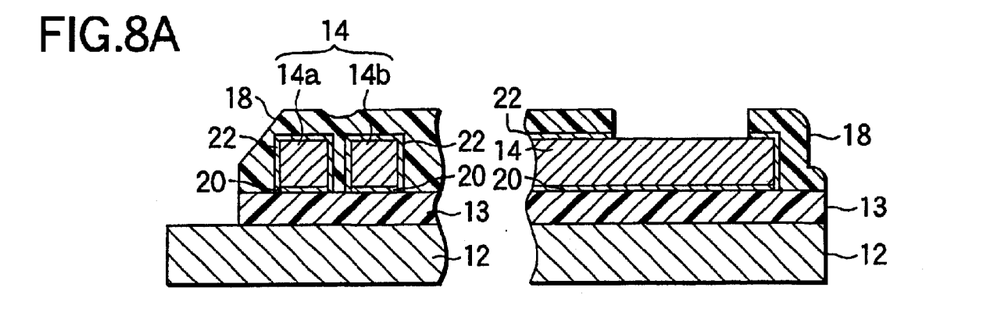
Figure 8B:
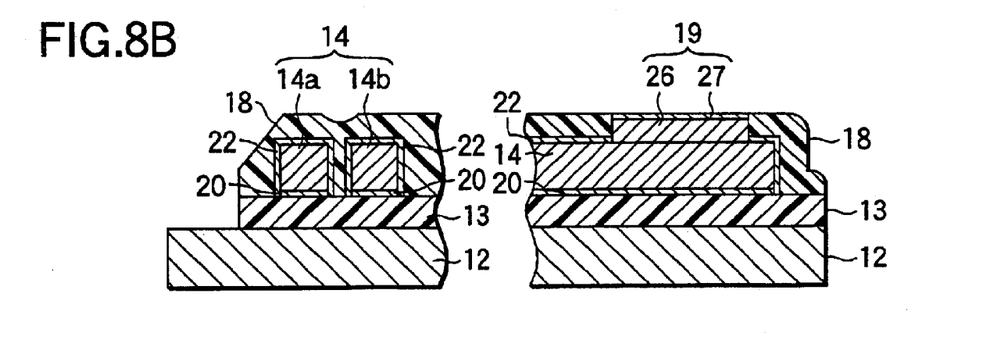
Figure 8C:
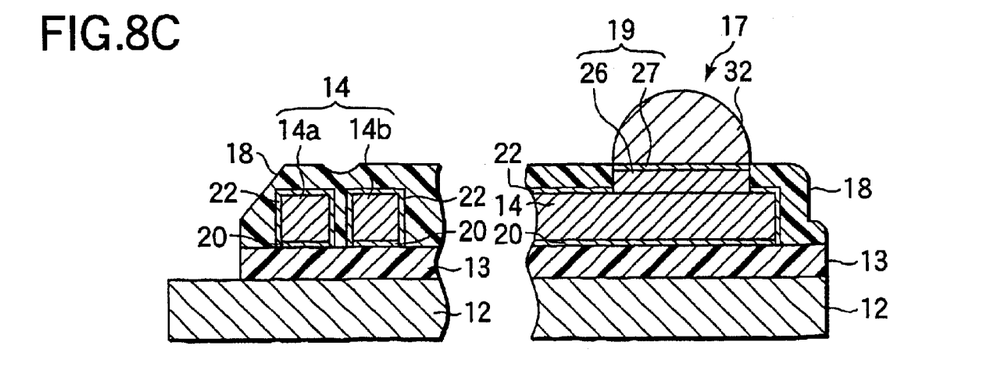

Next, as shown in FIGS. 8A to 8C, the external side connection terminals 17 are formed. To form the external side connection terminals 17, a part of the metal film 22 exposed by opening the cover layer 18 is first peeled off as shown in FIG. 8A. At the same time that the part of the cover layer 18 is peeled off, another part of the metal film 22 formed on the supporting substrate 12 is also peeled off. An underlying plating layer 19 is then formed on the exposed surface of the conductive layer 14. The underlying plating layer 19 is formed by a nickel plating layer 26 having a thickness of 1.0–4.0 µm, as described above. Either electrolytic plating or electroless plating may be used as the plating method, but electrolytic plating is preferably employed. For example, after the supporting substrate 12 and the cover layer 18 are partially covered with a resist while the remaining part is left for forming the underlying plating layer 19, electrolytic plating may be performed on the remaining part, and thereafter, the resist is removed. In such a manner, the underlying plating layer 19 is formed by electrolytic plating. In the underlying plating layer 19, a gold plating layer may be formed, if necessary, on the nickel plating layer 26 as described above. FIGS. 8A to 8C show a mode for forming a gold plating layer 27 by gold plating.

Next, in the case of forming the underlying layer 19 by electrolytic plating, a plating lead for use in the electrolytic plating is removed by chemical etching or the like, thereafter, the supporting substrate 12 is cut into a predetermined shape including the shapes for the gimbals 15 by a known method such as chemical etching or the like, and the cut supporting substrate 12 is cleaned and dried.

As shown in FIG. 8C, soldering bumps 32 are formed on the underlying plating layer 19. In such a manner, the circuit-provided suspension substrate 11 is formed.

Soldering paste which is a mixture of powder of solder having the metal components of the aforementioned composition with the organic binder is screen-printed on the underlying plating layer 19 and heated in a reflow furnace or the like, to thereby bake and remove the organic binder from the soldering paste. Accordingly, the soldering bumps 32 are formed. Thereafter, the soldering bumps 32 may be washed with water or cleaned with an organic solvent if necessary. Generally, each of the soldering bumps 32 formed thus is shaped substantially like a semicircle in section and has preferably a height (distance from its lower surface to its top) of 50–250 µm, more preferably a height of about 125 µm.

Although the above description has not made about a method for forming magnetic head side connection terminals 16, each of the magnetic head side connection terminals 16 may be formed similarly to the external side connection terminal 17 except that the soldering bump 32 is not formed.

In the circuit-provided suspension substrate 11 obtained thus, the soldering bumps 32 are formed respectively as the external side connection terminals 17 on the underlying plating layer 19 in which the nickel plating layer 26 having a thickness of 1.0–4.0 µm is formed (or on the gold plating layer 27 when the gold plating layer 27 is formed on the nickel plating layer 26 if it is necessary to do so). Accordingly, connection strength can be improved from the initial stage of connection. Therefore, if the external side connection terminals 17 are connected to the external terminals 28 of the read/write substrate 29 respectively by thermocompression bonding according to a conventional method, the external side connection terminals 17 can be connected to the external terminals 28 because of the high connection strength from the initial stage of connection. As a result, connection reliability can be improved.

Figure 9:
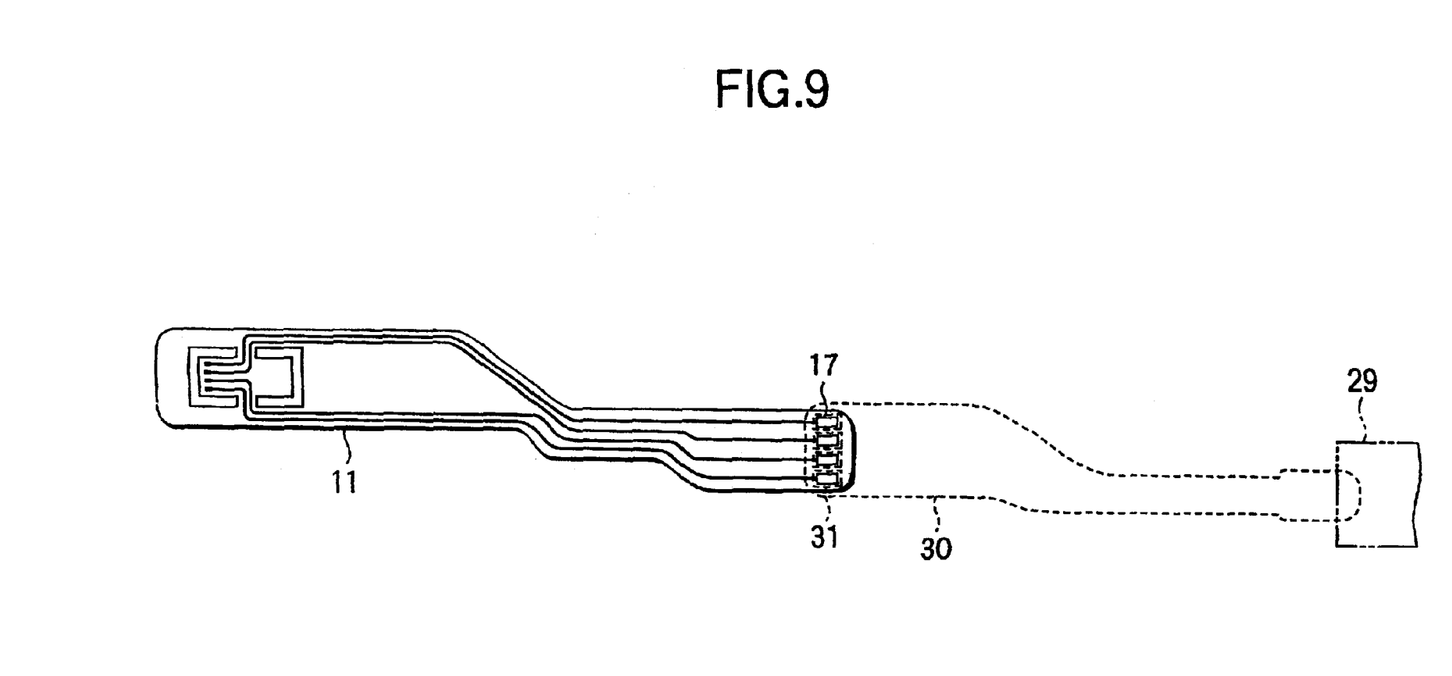
FIG. 9 is a plan view showing a circuit-provided suspension substrate of a short tail type.

The circuit-provided suspension substrate 11 described above is of a so-called long tail type in which the external side connection terminals 17 are connected to the external terminals 28 of the read/write substrate 29, respectively. However, the circuit-provided suspension substrate is not limited to this type. For example, as shown in FIG. 9, a so-called short tail type may be used. That is, in the circuit-provided suspension substrate 11 of the short tail type, the circuit-provided suspension substrate 11 is connected to the read/write substrate 29 through a junction substrate 30 and the external side connection terminals 17 of the circuit-provided suspension substrate 11 are connected to terminals 31 of the junction substrate 30 respectively.

EXAMPLES

Hereinafter, the present invention will be described more specifically with reference to examples and a comparative example. However, the present invention is not limited to these examples and comparative example.

Example 1

A solution of photosensitive polyamic acid resin was applied onto a film of stainless foil having a thickness of 25 µm and heated at 130° C. to thereby form a film of photosensitive polyamic acid resin. Next, the film was exposed through a photo mask (405 nm, 1,500 mJ/cm$^2$), and then developed by using an alkali developer after the exposed portion of the film was heated to 180° C. In such a manner, the film was patterned to be a negative image. Next, the patterned film of photosensitive polyamic acid resin was heated at 350° C. and cured (imidized) so that abase layer composed of polyimide resin and having a thickness of 15 µm was formed into the predetermined pattern.

Subsequently, after a chrome thin film 300 Å thick and a copper thin film 700 Å thick were formed successively as a underlying layer on the entire surface of the film of stainless foil and the entire surface of the base layer by sputtering deposition, a plating resist in an inverse pattern to a predetermined circuit pattern was formed by using a dry film resist, and a conductive layer in the predetermined circuit pattern was formed by electrolytic copper plating on the portion of the underlying layer where the plating resist was not formed. Thereafter, the plating resist was removed by chemical etching, and then, the chrome thin film and the copper thin film on which the plating resist was formed were removed by chemical etching. Incidentally, the thickness of the conductive layer was set to 20 µm and the pattern of the conductive layer was formed into a pattern in which four wirings were disposed in parallel on another at a predetermined interval. The width of each wiring and the interval between each two of the wirings were 20 µm and 30 µm, respectively.

Next, after a hard nickel film having a thickness of 0.1 µm was formed on the surfaces of the conductive layer and the film of stainless foil by electroless nickel plating, a solution of photosensitive polyamic acid resin was applied onto the nickel film and the base layer, and a film of photosensitive polyamic acid resin was formed by heating the applied solution of photosensitive polyamic acid resin at 130° C. Next, the film was exposed through a photo mask (405 nm, 1,500 mJ/cm$^2$), and then developed by using an alkali developer after the exposed portion of the film was heated to 180° C. In such a manner, the film of photosensitive polyamic acid resin was patterned to cover the conductive layer. Next, the patterned film of photosensitive polyamic acid resin was heated at 350° C. and cured (imidized), so that a cover layer composed of polyimide resin and having a thickness of 3 µm was formed on the conductive layer. Incidentally, the formation of the cover layer was designed so that the cover layer did not cover specific portions of the conductive layer where magnetic head side terminals and external side connection terminals were to be formed.

The nickel film formed on the specific portions of the film surface of the stainless foil and the conductive layer where the magnetic head side terminals and the external side connection terminals were to be formed on the conductive layer were peeled off, and electrolytic nickel plating and electrolytic gold plating were sequentially carried out on the specific portions so as to form a nickel plating layer 1.3 μm thick and a gold plating layer 0.4 μm thick. Thereafter, the plating lead for use in the electrolytic nickel plating and electrolytic gold plating was removed by chemical etching, and the film of stainless foil was cut into a predetermined shape by chemical etching. The cut film of stainless foil was then cleaned and dried.

Soldering bumps were formed on the gold plating layer of the external side connection terminals so that the circuit-provided suspension substrate was formed.

The soldering bumps were formed by screen-printing soldering paste, which contains 37% lead by weight and 63% tin by weight as metal components, on the gold plating layer and by heating the screen-printed soldering paste in a reflow furnace. Each of the soldering bumps had a height of 125 μm.

The circuit-provided suspension substrate obtained thus corresponds to the mode shown in FIG. 4, and the external side connection terminals correspond to the mode shown in FIG. 8C.

Example 2

A circuit-provided suspension substrate was manufactured in a manner similar to that in Example 1 except that the thickness of the nickel plating layer was set to 2.2 μm.

Example 3

A circuit-provided suspension substrate was manufactured in a manner similar to that in Example 1 except that the thickness of the nickel plating layer was set to 3.8 μm.

Example 4

A circuit-provided suspension substrate was manufactured in a manner similar to that in Example 1 except that the thickness of the nickel plating layer was set to 2.2 μm and that the soldering bumps were formed by screen-printing soldering paste, which contains 95.8% tin by weight, 3.5% silver by weight and 0.7% copper by weight as metal components, on the gold plating layer and by heating the screen-printed soldering paste in a reflow furnace.

Comparative Example 1

A circuit-provided suspension substrate was manufactured in a manner similar to that in Example 1 except that the thickness of the nickel plating layer was set to 0.7 μm.

Evaluations

1) Manufacturing of Joined Base Material

Figure 10A:
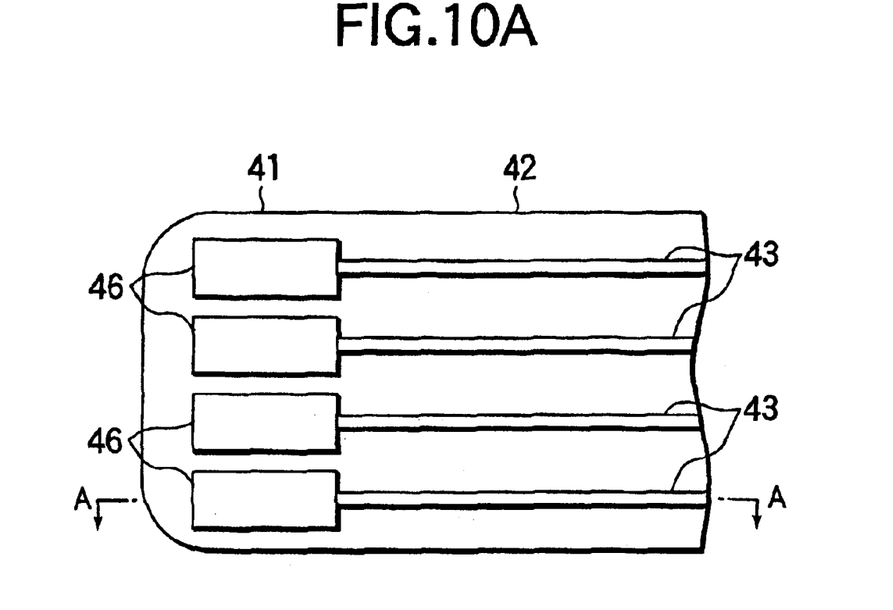
FIG. 10A is a top view of a joined base material for use in evaluation.
Figure 10B:
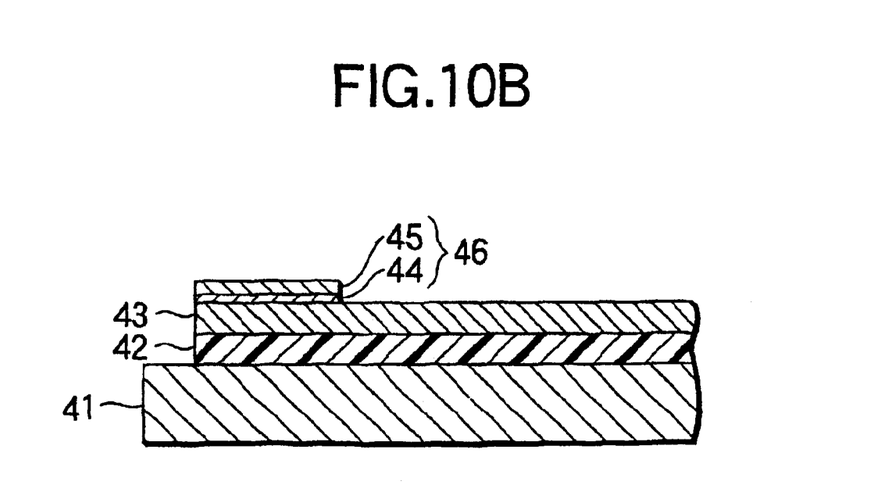
FIG. 10B is a sectional view taken along the line A—A of FIG. 10A.

A base material as shown in FIGS. 10A and 10B was prepared as a joined base material. That is, FIGS. 10A and 10B show the joined base material was produced as follows. A base layer 42 composed of polyimide resin and having a thickness of 10 μm was laminated on a supporting substrate 41 constituted by a film of stainless foil and having a thickness of 25 μm, a conductive layer 43 containing copper and having a thickness of 10 μm was formed on the base layer 42 as a pattern of four wirings, and a nickel plating layer 44 of 2 μm thick and a gold plating layer 45 of 5 μm thick were formed successively on an end of the four wirings to thereby form four external terminals 46.

2) Junction Between Circuit-Provided Suspension Substrate and Joined Base Material Four soldering bumps of the external side connection terminals of the circuit-provided suspension substrate according to each of Examples 1 through 4 and Comparative Example 1 were disposed in alignment with the four external terminals of the joined base material and subjected to thermocompression bonding under pressure of 3,920 mN at 150° C. for 3 seconds, and then, at 350° C. for 8 seconds.

3) Heat Cycle Test

A heat cycle test was carried out on a joined sample by repeating 500 cycles under the following low-temperature and high-temperature conditions.

Figure 11:
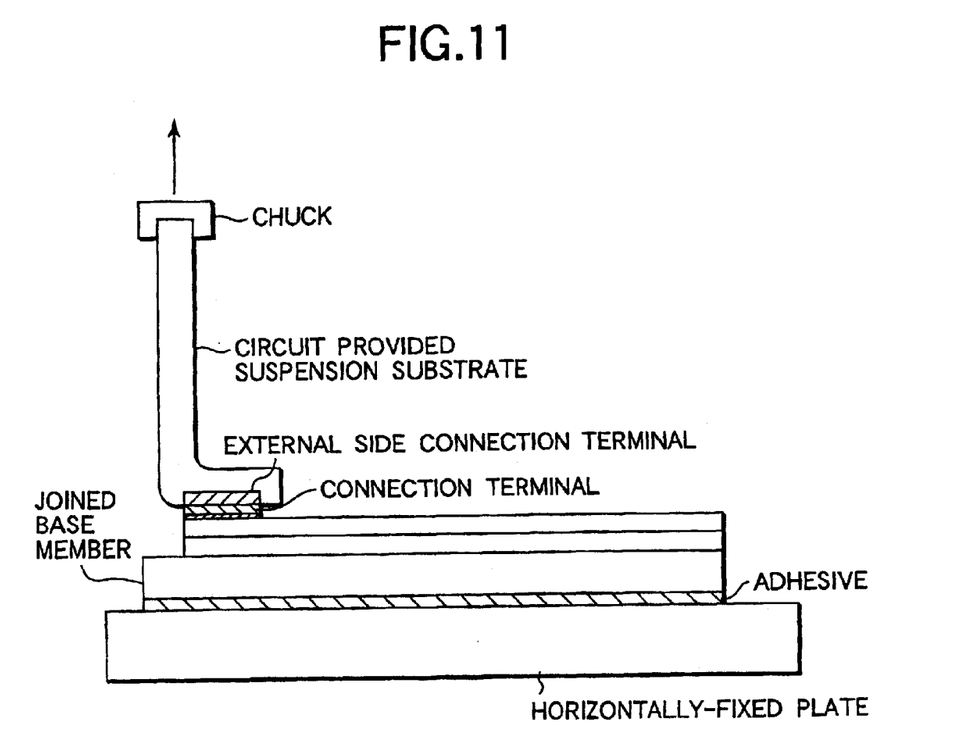
FIG. 11 is a view for explaining a 90° peel test.

Low-Temperature Condition: −40° C., 30 minutes
High-Temperature Condition: 125° C., 30 minutes 4) Peel Test A 90° peel test was performed on each sample before and after the heat cycle test so as to evaluate the connection property between the terminals. That is, in the 90° peel test, as shown in FIG. 11, the joined base material was fixed onto a horizontally-fixed plate with an adhesive, and an end portion opposite to the joined portion in the circuit-provided suspension substrate was subjected to chucking and pulled in the state in which the circuit-provided suspension substrate was bent upward by 90°. Measuring conditions are indicated below. Table 1 shows measurement results. In Table 1, the base material fracture represents the state in which fracture occurs not in the joined portion but in the base material, the interfacial fracture represents the state in which fracture occurs at an interface between the gold plating layer and the soldering bumps, and the fracture strength indicates strength at each terminal.

Pulling Tester: AIKOHENGINEERING MODEL1011/MODEL1321DW
Peel Speed: 10 mm/min

TABLE 1

| | | Ex. 1 | Ex. 2 | Ex. 3 | Ex. 4 | Com. Ex. 1 |
|---|---|---|---|---|---|---|
| Solder composition | | Pb/Sn | Pb/Sn | Pb/Sn | Sn/Ag/Cu | Pb/Sn |
| Thickness of nickel plating layer (μm) | | 1.3 | 2.2 | 3.8 | 2.2 | 0.7 |
| Peel test | Connection strength before heat cycle test (mN) | 320 | 500 | 500 | 550 | 95 |
| | Connection strength after heat cycle test (mN) | 100 | 100 | 100 | 550 | 70 |
| | Fracture form | Interfacial fracture | Interfacial fracture | Interfacial fracture | Base material fracture | Interfacial fracture |

As is apparent from Table 1, the circuit-provided suspension substrate according to each of Examples 1 through 4 has connection strength greater than that of the circuit-provided suspension substrate according to Comparative Example 1 before the heat cycle test (in the initial stage of connection). Table 1 further shows that, in Example 4 in which the soldering bumps containing tin, silver and copper were formed, the connection strength is great and connection property is good even after the heat cycle test.

As has been described above, in the circuit board and the connection structure of the terminal portion of the circuit board according to the present invention, the nickel plating layer having a thickness of 1.0–4.0 μm and the soldering bumps are formed in the terminal portion, so that improvement of connection strength can be ensured from the initial stage of connection. Therefore, the present invention is suitably applicable to the circuit-provided suspension substrate and to the connection structure of the terminal portion of circuit-provided suspension substrate which require high connection strength from the initial stage of connection. Accordingly, the connection reliability can be improved.

What is claimed is:

1. A circuit board comprising:

a terminal portion connected with an external terminal formed in an external circuit, said terminal portion provided with a nickel plating layer and a soldering bump provided on the terminal portion;

wherein a thickness of said nickel plating layer is within a range of 1.0 to 4.0 μm, wherein said terminal portion further includes a base layer, and a conductive layer disposed between said base layer and said nickel plating layer, wherein a thickness of said base layer comprises polyimide resin, wherein said soldering bump contains tin and at least one of silver and copper.

2. A circuit board according to claim 1, wherein said soldering bump contains tin, silver and copper.

3. A circuit board according to claim 1, wherein said circuit board is a circuit provided suspension substrate.

4. The circuit board according to claim 1, wherein a thickness of the base layer is 2–30 μm.

5. The circuit board according to claim 1, wherein a thickness of the conductive layer is 3–25 μm.

6. The circuit board according to claim 1, wherein the terminal portion further includes a cover layer disposed on said base layer, having a thickness of 0.5–8.0 μm.

7. The circuit board according to claim 1, wherein a composition ratio of said soldering bump is 0.3–3.5% by weight of said silver.

8. The circuit board according to claim 1, wherein a composition ratio of said soldering bump is 0.2–1.2% by weight of said copper.

9. The circuit board according to claim 2, wherein a composition ratio of said soldering bump is 95–97% by weight of said tin, 0–4% by weight of said silver, and 0–4% by weight of said copper.

10. A connection structure for connecting a terminal portion of a circuit board with an external terminal formed in an external circuit, wherein said terminal portion is provided with a nickel plating layer and a soldering bump containing tin and at least one of silver and copper provided on said terminal portion and a thickness of said nickel plating layer is within a range of 1.0 to 4.0 μm, and wherein said terminal portion is further provided with a base layer and a conductive layer, which is disposed between said base layer and said nickel plating layer, and wherein said base layer comprises polyimide resin.

* * * * *